(12) United States Patent
Ahmad et al.

(10) Patent No.: US 7,408,362 B2
(45) Date of Patent: Aug. 5, 2008

(54) ELECTRONIC PACKAGE AND METHOD FOR TESTING THE SAME

(75) Inventors: Shakil Ahmad, Singapore (SG); Poh Sing Kang, Singapore (SG); Narang Jasmeet Singh, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/759,736

(22) Filed: Jun. 7, 2007

(65) Prior Publication Data

US 2007/0285103 A1    Dec. 13, 2007

Related U.S. Application Data

(63) Continuation of application No. PCT/IB2004/004021, filed on Dec. 7, 2004.

(51) Int. Cl.
*G01R 31/08* (2006.01)
(52) U.S. Cl. ..................... 324/527; 324/76.11; 714/735
(58) Field of Classification Search ................ 324/527, 324/76.11; 714/735, 724
See application file for complete search history.

(56) References Cited

U.S. PATENT DOCUMENTS 4,241,307 A    12/1980   Hong 6,492,798 B2 *  12/2002   Sunter .................. 324/76.15
2002/0053056 A1 *  5/2002   Kuegler et al. ............ 714/733
2004/0006752 A1    1/2004   Whetsel
2004/0181729 A1 *  9/2004   Whetsel .................... 714/742

FOREIGN PATENT DOCUMENTS

EP          0430128  B1    6/1991
EP          0273821  B1    10/1994

* cited by examiner

*Primary Examiner*—Vincent Q Nguyen
(74) *Attorney, Agent, or Firm*—Edell, Shaprio & Finnan, LLC

(57) ABSTRACT

An integrated circuit package includes at least two electronic circuits. A first of the at least two electronic circuits includes a digital input and a digital output and a test mode control line for setting the first integrated circuit chip into a determined test mode. The digital input includes at least two parallel input paths and the digital output includes at least two parallel output paths. The at least two parallel input paths and at least two parallel output paths provide a corresponding number of internal paths by which the first electronic circuit and a second electronic circuit can be tested essentially simultaneously.

7 Claims, 4 Drawing Sheets

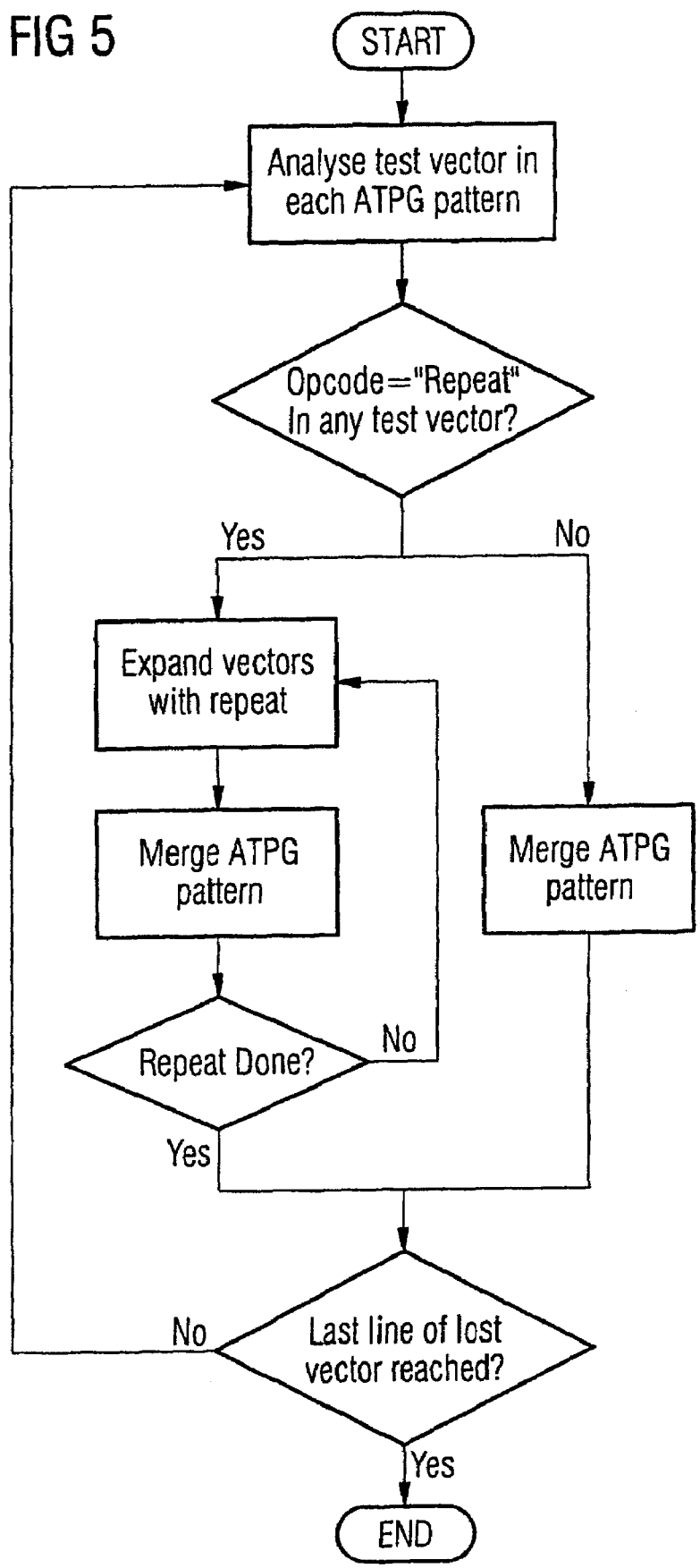

ELECTRONIC PACKAGE AND METHOD FOR TESTING THE SAME

CROSS REFERENCE TO RELATED APPLICATIONS

This application is a continuation of International Application No. PCT/IB2004/004021, filed on Dec. 7, 2004, entitled "Test Time Reduction for Multi-Chip Modules (MCM) and for System-In-Packages (SIP)," the entire contents of which are hereby incorporated by reference.

BACKGROUND

After a semiconductor chip has been manufactured, it undergoes a testing sequence to determine if the chip is functioning correctly. The testing can be performed using an automatic test pattern generation (ATPG) technique in which an ATPG pattern is generated specifically to test the functionality of this particular type of chip. However, this technique has the disadvantage that the ATPG patterns are large and the time required to test the chip is quite long. This problem is exacerbated in Multi-Chip Modules (MCM) and System-In-Package (SIP) components which include two or more chips to be tested. The long testing times required ultimately increase the cost of producing the chip or module.

Large test patterns also require a larger tester memory to store the patterns. Therefore, the tester resources required is increased and also increases complexity and the total cost of testing and manufacturing the chip or module.

SUMMARY

Methods of testing a Multi-Chip Module which avoid the problems associated with the known testing techniques, reduce the required testing time and, therefore, the cost of manufacturing the module are described herein. Furthermore, a semiconductor package which includes at least two electronic circuits is also described herein, in particular a semiconductor package with at least two chips providing a multi-chip module. In this description, the phrase semiconductor package is used to denote a Multi-Chip Module or System-In-Package electronic component. A first of the at least two electronic circuits includes a digital input and a digital output and a test mode control line for setting the first semiconductor chip into a determined test mode. The digital input includes at least two parallel input paths and the digital output includes at least two parallel output paths. The at least two parallel input paths and at least two parallel output paths provide a corresponding number of internal paths by which the first electronic circuit and a second electronic circuit can be tested at essentially the same time.

The above and still further features and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The described device and methods are explained in more detail below with reference to the accompanying drawings, where:

FIG. 5 shows a flowchart of the method by which the test patterns of FIG. 3 are merged to and from the test pattern of FIG. 4.

DETAILED DESCRIPTION

Figure 1:
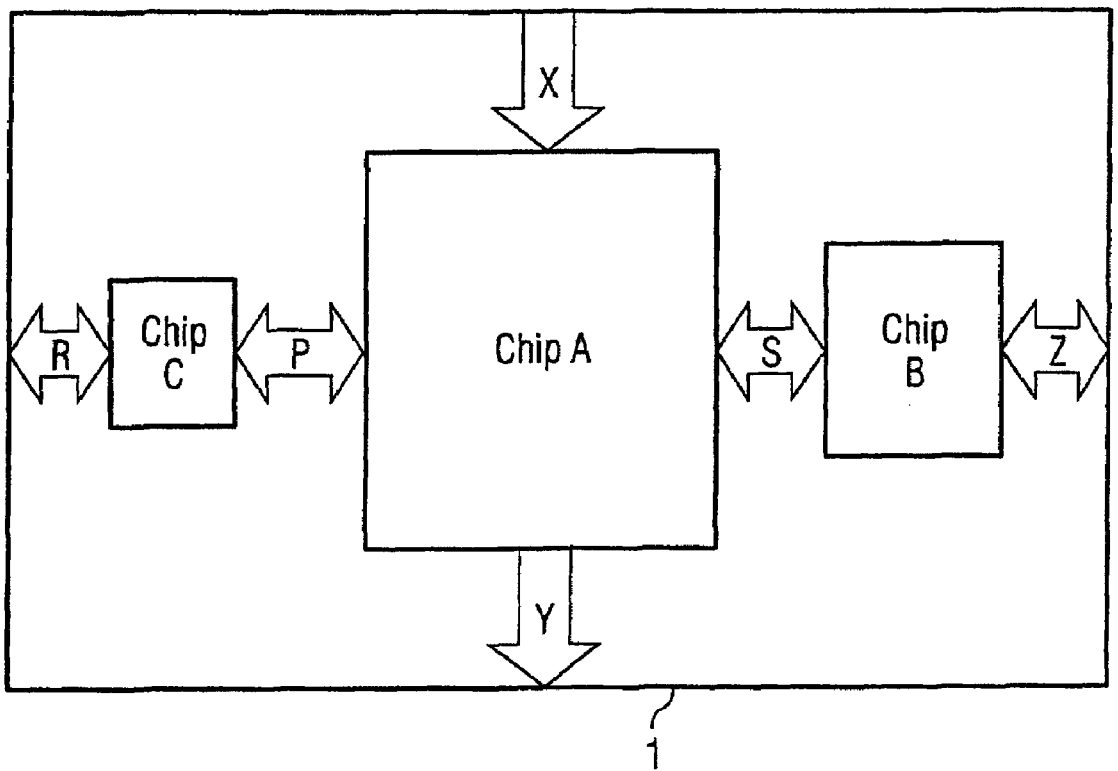
FIG. 1 shows a first multi-chip module with three semiconductor chips.

According to an exemplary embodiment, a semiconductor package includes at least two electronic circuits. A first of the at least two electronic circuits includes a digital input and a digital output and a test mode control line for setting the first semiconductor chip into a determined test mode. The digital input includes at least two parallel input paths and the digital output includes at least two parallel output paths. The at least two parallel input paths and at least two parallel output paths provide a corresponding number of internal paths by which the first electronic circuit and a second electronic circuit can be tested at essentially the same time. For example, if the first circuit includes three parallel digital input paths and three parallel digital output paths, three internal paths are provided in the package. As will be discussed in more detail below, this arrangement advantageously allows data to be processed in at least two internal paths essentially at the same time.

The semiconductor package also includes at least one second circuit which is digitally coupled with the first circuit via an internal digital input/output path. Each second circuit also includes a test mode control line for setting the second circuit into a determined test mode, thus enabling the second circuit to be tested.

When in the test mode, the first circuit is adapted to direct the data from one digital input path of the first circuit to the second circuit via the internal digital input/output path. This first circuit is also adapted to direct the data received at the internal path from the second circuit to one digital output path of the first circuit.

The second circuit, while in the test mode, is adapted to process the data received at the internal path and to direct the processed data to the first circuit via the internal digital input/output path.

This configuration enables the second circuit to be tested by a signal or data applied to the digital input path of the first circuit and output from the digital output path of the first circuit. This advantageously reduces the number of pins required in the package as digital input and output pins are not required specifically for the second circuit.

The first circuit, while in the test mode, is also adapted to process the data received at a second digital input path and to direct the processed data to a second digital output path. Therefore, the first circuit is also tested by a signal or data applied to the digital input path of the first circuit.

Therefore, in the described semiconductor package data is, advantageously, processed in the first circuit at the same time as data is processed in the second circuit. Therefore, both chips can be tested at essentially the same time and testing time is reduced.

Optionally, the first circuit comprises a device to separate data at the digital input into data which is to be processed by the second circuit and into data which is to be processed by the first circuit. This enables data, which is for example an ATPG pattern, to be input into the package and the data appropriate for testing each chip to be separated and transferred to the appropriate chip.

In a further embodiment, the second circuit may also include an analog module.

Methods for electronically testing the described semiconductor package, in particular methods for testing the functionality of the electronic circuits of the package are also described herein. First, the digital input and digital output paths are connected to an electronic testing device. This is optionally performed by the external contacts of the package such as pins electrically connected to the input and output paths. If the package includes analog input and analog output paths, these are also connected to the electronic testing device.

A test pattern such as an ATPG pattern is provided for each circuit in the semiconductor package. The test pattern includes a plurality of lines, each comprising a signal to be applied to the chip and its expected output. The test pattern can include ATPG patterns as well as functional patterns which cause the chips to test a desired operation or function such as "register access" in one chip and "Media Independent Interface" and the other chip using serial interface. The first circuit and the second circuit are then set into a predetermined test mode.

A merged test pattern is produced by merging a respective line of each of the test patterns of the electronic circuits to form a single line in the merged test pattern. This advantageously enables each electronic circuit to be tested essentially at the same time as a single line of the merged test pattern is applied to the digital input of the first circuit. The data input is then separated by the first circuit and the appropriate data sent to and processed by the first and second circuits.

When the first and second circuits are in test mode, the first circuit directs the data at a first input path to the second circuit via the internal digital input/output path and the first circuit directs the data received at the internal digital input/output path to a first output path.

The first circuit processes the data at a second input path and directs the processed data to a second output path at essentially the same time. Due to the provision of a plurality of parallel digital input and output paths and the coupling of the first and second circuits, the functionality of the first circuit can be tested at essentially the same time as the functionality of the second circuit.

The second circuit processes the data received at the internal digital input/output path and directs the processed data to the first circuit via the internal digital input/output path. This enables the second circuit to be tested by the data input at the digital input paths of the first circuit. The number of external digital input and outputs required to test the package is, therefore, reduced.

Furthermore, since the test patterns for each chip are merged line-by-line into a single merged test pattern, the data required for testing both the first and second chip is included in the same line of the test pattern. The processing of the test data in the first circuit and in the second circuit is performed essentially in parallel.

The output data of each digital output path is evaluated and compared with the expected data included in the test pattern. If the measured output deviates from the expected output, then the package is identified as containing a fault.

Therefore, at least two circuits or semiconductor chips are advantageously tested in parallel at essentially the same time as a merged test pattern is used in which each line of the test pattern includes data for each semiconductor package.

However, the individual test patterns for each chip may not be of the same length, i.e., contain the same number of lines. In this case, according to an exemplary embodiment, NOP instructions are written in one part of the test data, for example, in one part of a line of the merged ATPG pattern, when the other part still comprises valid test operation instructions.

Therefore, the testing of one chip continues after the testing of a second chip is completed. This has the advantage that test patterns of any length can be merged and the testing time saving still be obtained. The testing method is, therefore, extremely flexible and can be used for parallel testing of different types of circuit and chips.

Optionally, the method is carried out using a computer program product including a computer program. The computer program can be held on a storage medium, a computer memory or a direct access memory. The computer program for carrying out the method can be transmitted on an electric carrier signal.

Optionally, the computer program can be downloaded from an electronic data network onto a computer which is connected to the data network (e.g., the Internet).

In the following paragraphs, exemplary embodiments of the semiconductor package and methods are described in connection with the figures.

FIG. 1 shows a schematic diagram of a multi-chip module 1 according to a first embodiment. The multi-chip module 1 includes three semiconductor chips A, B and C. For example, semiconductor chip A is an ADSL digital data pump, Chip B an ADSL analog Front end chip, and Chip C an Ethernet chip.

Chip A includes a digital input path X and a digital output path Y which enable a digital signal to be respectively input and output to the package 1 by respective primary input X and output Y pins (which are not shown in the figure). Chip A also includes a test mode control line (which is also not shown in the figure) so that the chip can be set into a determined test mode. Chip A is also digitally coupled to semiconductor chip C by an internal input/output digital path P and to semiconductor chip B by an internal digital input/output path S.

Semiconductor chips B and C also each include an analog signal input/output path Z and R respectively. Signal paths Z and R enable an analog signal to be applied to the module 1 via the package pins Z and R (not shown in the figure) which form external contacts of the module 1. Chips B and C further include analog circuits which are not shown in the diagram. The multi-chip module 1 also includes additional lines, also not shown in the diagram, for setting the chips B and C into a predetermined test mode.

In multi-chip module 1, chip A can be tested using the Path X-Y, chip B by paths X-S-Z, Z-S-Y and X-S-Y and chip C by the paths X-P-R, R-P-Y and X-P-Y. To test each of the three semiconductor chips of the multi-chip module 1, at least three test modes are used, for example X-Y for chip A, X-S-Y for chip B and X-P-Y for chip C.

Figure 2:
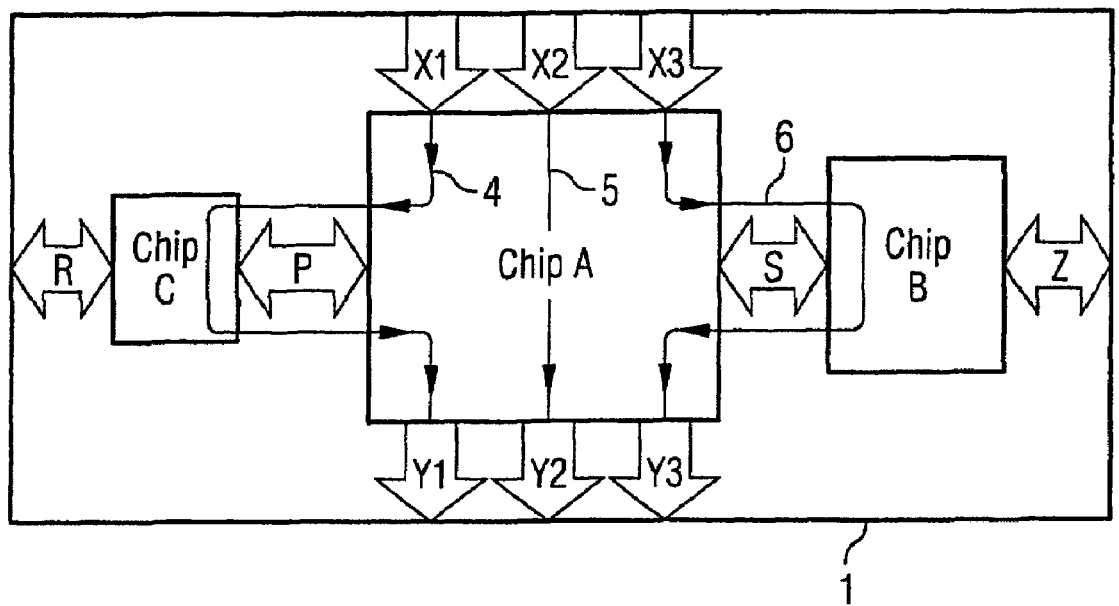
FIG. 2 shows the multi-chip module of FIG. 1 in more detail.

FIG. 2 shows a more detailed schematic diagram of the multi-chip module 1. Parts of the module 1 which are essentially the same as those shown in FIG. 1 and denoted by the same reference are not necessarily described again.

FIG. 2 shows that the multi-chip module 1 includes three parallel digital inputs X1, X2 and X3 and three parallel digital outputs Y1, Y2 and Y3 with respective primary package input and output pins. The semiconductor chips A, B and C in multi-chip module 1 are electrically configured to provide three test paths X2-Y2, X3-S-Y3 and X1-P-Y1 respectively. These test paths are shown diagrammatically by the arrows 4, 5 and 6 respectively.

The semiconductor chip A, when set in the test mode, therefore directs data at one input path X1 to the semiconductor chip C via the internal path P and directs the data received at the internal path P to one output path Y1. The semiconductor chip A also processes the data at input path X2 directs the processed data to the output path Y2.

Semiconductor chip C, when set in the test mode, processes the data received at the internal path P directs the processed data to semiconductor chip A via the internal path P.

Similarly semiconductor chip A, when set in the test mode, directs data at one input path X3 to the semiconductor chip B via the internal path S and directs the data received at the internal path S to one output path Y3.

Semiconductor chip B, when set in the test mode, processes the data received at the internal path S directs the processed data to semiconductor chip A via the internal path S.

The semiconductor chip A, therefore, also has a device to separate data at the digital input X into data which is to be processed by semiconductor chips B and C and into data which is to be processed by semiconductor chip A.

Figure 3:
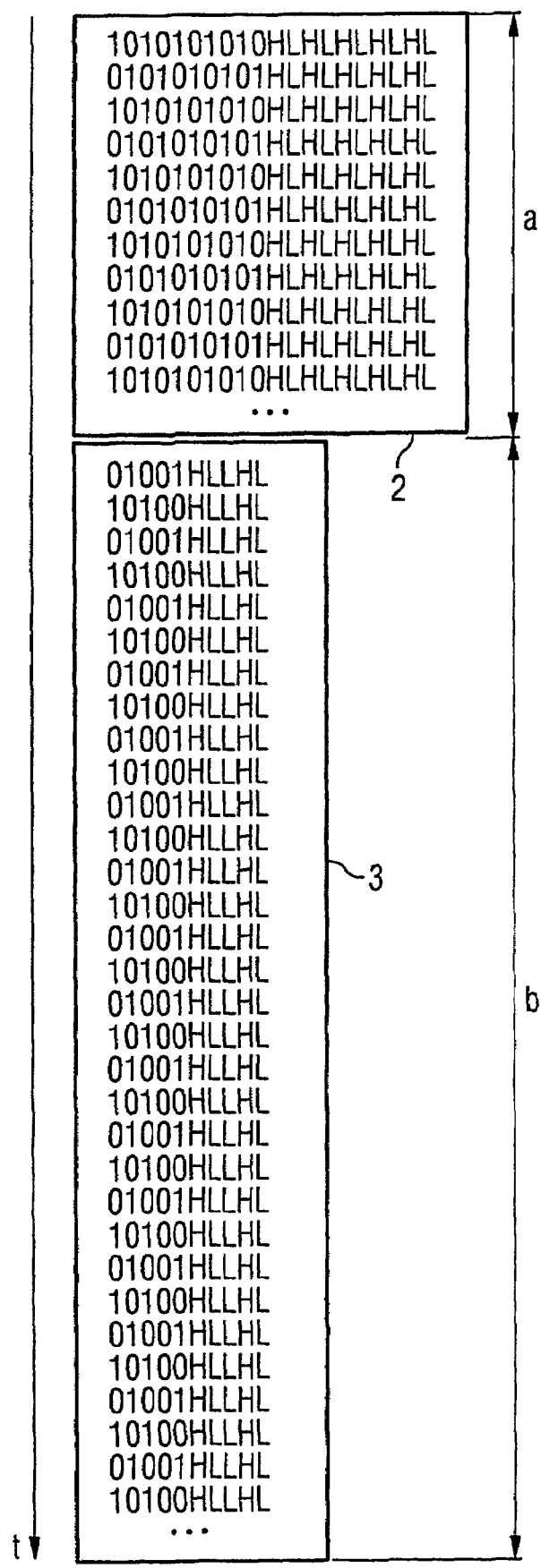
FIG. 3 illustrates two test patterns for sequentially testing two semiconductor chips of the multi-chip module of FIG. 1 or FIG. 2.

In order to test each chip in the multi-chip module, an Automatic Test Pattern Generation (ATPG) is generated for each chip in the module. FIG. 3 shows a schematic diagram of the ATPG pattern 2 for testing chip A and ATPG pattern 3 for chip B. Each pattern 2, 3 includes a test vector including a series of lines. The first half of the line, for example 1010101010 for Chip A, represents the signal input to chip A and the second half of the line, for example HLHLHLHL, represents the expected output if the chip A is functioning correctly. The actual output is measured by test nodes not shown in FIG. 1 and the measured output is compared with the expected output to determine if the chip is functioning as desired. If the measured output deviates from the expected output, the package is deemed to have an error.

FIG. 3 shows a first test pattern or ATPG 2 for testing Chip A and a second test pattern or ATPG 3 for testing Chip B. Each line is run sequentially in time t from top to bottom of the diagram so that Chip A is tested in a time a and then Chip B is tested in time b. The total test time for the two chips A and B is, therefore, a+b.

Since in the multi-chip module 1 of the exemplary embodiment, the input paths X1, X2, and X3 and output Y1, Y2 and Y3 paths are configured in parallel, the three test paths X1-P-Y1, X2-Y2 and X3-S-Y3 are able to be tested in parallel.

According to the exemplary embodiment, in order to reduce the testing time of the multi-chip module 1, the ATPG test patterns for each of the paths X1-P-Y1, X2-Y2 and X3-S-Y3 are merged and run in parallel. Therefore, instead of the chips A, B and C being tested individually and sequentially as shown in FIG. 3, the chips A, B and C are tested in parallel.

This is achieved by merging the ATPG patterns for the paths X1-P-Y1, X2-Y2 and X3-S-Y3. This is demonstrated in FIG. 4 for the parallel testing of chips A and B. The method may be extended to test any number of chips in parallel.

Figure 4:
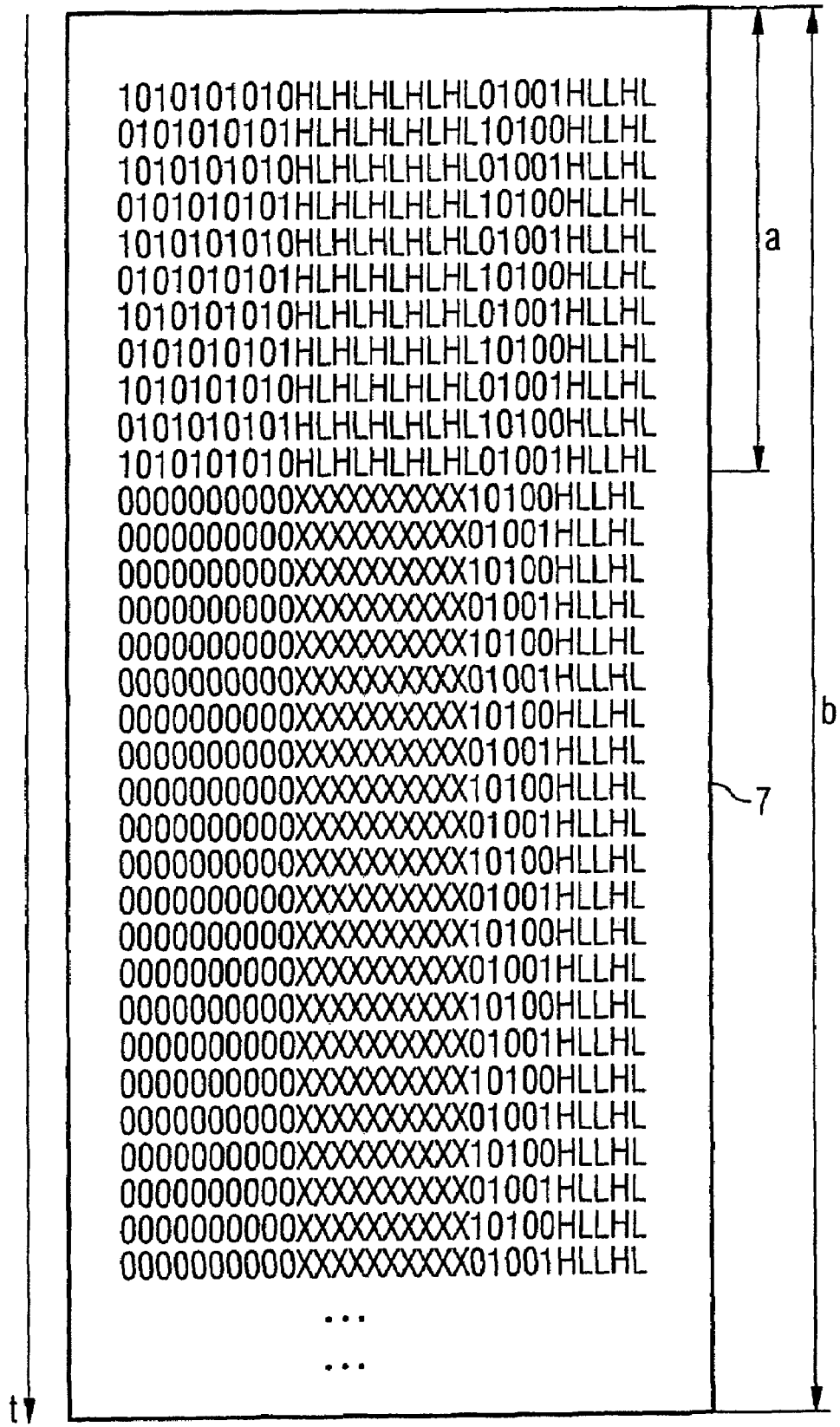
FIG. 4 illustrates a test pattern for testing two semiconductor chips of the multi-chip module of FIG. 3 in parallel.

FIG. 4 shows an ATPG pattern 7 in which the patterns 2, 3 of FIG. 3 for the chips A and B have been merged into a single pattern 7. As can be seen in the first 11 lines of the merged pattern 7, each respective line of the patterns 2 and 3 of FIG. 3 including the input signal and expected output signals for the Chips A and B are merged to from a single line. The chips 2, 3 are tested in parallel. For lines 12 onwards in the merged pattern 7, the testing of Chip A is complete so that an NOP instruction of 0000000 is applied to chip A. It can, therefore, be seen from FIG. 4 that via the multi-chip module 1 which includes the parallel digital input X1, X2 and X3 and output Y1, Y2 and Y3 paths and the use of the merged ATPG pattern 7, the testing time for the two chips is reduced to the time required to test chip B (i.e., the total testing time is reduced to b).

FIG. 5 shows a flowchart of the method by which the ATPG patterns of each semiconductor chip in a multi-chip module are combined. Each ATPG pattern is generated at the same scan clock speed which is typically 10 MHz. To merge the ATPG test pattern, each test vector in the ATPG pattern is analyzed for repeat Opcode. If there are no repeats, the vectors are merged into a single test vector. If there are repeat test vectors for a chip, the vectors are expanded and merged.

As illustrated by the previous diagrams, the provision of parallel digital input and output paths enables the parallel testing of the semiconductor chips in a multi-chip module via a test algorithm in which the ATPG test patterns of each chip are merged and the chips tested in parallel. This is extremely advantageous as the testing time for each module is reduced and, consequently, production costs are saved.

The invention is also characterized by the following sets of elements:

1. A semiconductor package including at least two electronic circuits, a first circuit having a digital input and a digital output and a test mode control line for setting the first chip into a determined test mode, wherein the digital input includes at least two parallel input paths and the digital output includes at least two parallel output paths, the at least two parallel input paths and at least two parallel output paths providing a corresponding number of internal paths, and at least one second circuit being digitally coupled with the first circuit via an internal input/output path and having a test mode control line for setting the second circuit into a determined test mode, the first circuit, in the test mode, being adapted to direct the data at one input path to the second circuit via the internal path and the first circuit being adapted to direct the data received at the internal path to one output path, the first circuit, in the test mode, being adapted to process the data at one other input path and to direct the processed data to one other output path, the second circuit, in the test mode, being adapted to process the data received at the internal path and to direct processed data to the first circuit via the internal path.

2. A semiconductor package (1) according to item 1 wherein data is processed in the first circuit at the same time as data is processed in the second circuit.

3. A semiconductor package (1) according to item 1 or item 2 wherein the electronic circuits are semiconductor chips.

4. A semiconductor package (1) according to one of the previous items wherein the second circuit includes an analog module.

5. A semiconductor package (1) according one of the previous items wherein the first circuit has a device to separate data at the digital input into data which is to be processed by the second circuit and into data which is to be processed by the first circuit.

6. A method for electronically testing a semiconductor package (1) having the following steps:

providing the semiconductor package of one of items 1 to 5, connecting the digital input, digital output and analog input and analog output paths to an electronic testing device, providing a test pattern (2, 3) for each electronic circuit including a signal to be applied to the chip and its expected output, producing a merged test pattern (7) by merging the respective lines of the test pattern (2, 3) of each electronic circuit to form a single line in the merged test pattern (7), setting the first circuit and the second circuit into a predetermined test mode, in which the first circuit directs the data at one input path to the second circuit via the internal path and the first circuit directs the data received at the internal path to one output path, and the first circuit, processes the data at one other input path and directs the processed data to one other output path, and the second circuit processes the data received at the internal path and directs the processed data to the first circuit via the internal path the data processing of the test data in the first circuit and in the second circuit being performed essentially in parallel, applying each line of the merged test pattern (7) to the parallel digital input paths of the electronic package, evaluating the output, comparing the measured output with the expected pattern, identifying packages in which the measured output deviates from the expected output.

7. A method for electronically testing a semiconductor package (1) according to item 6, wherein NOP instructions are written in one part of the test data when the other part still comprises valid test operation instructions.

8. A computer program product including a computer program for carrying out a method for electronically testing a semiconductor package (1) including at least two electronic circuits of one of items 1 to 5 which is in a form such that a method as claimed in one of items 6 or 7 can be carried out.

9. The computer program of item 8, which is held on a storage medium.

10. The computer program of item 8, which is stored in a computer memory.

11. The computer program of item 8, which is held in a direct access memory.

12. The computer program of item 8, which is transmitted on an electric carrier signal.

13. A data storage medium holding a computer program product including a computer program of item 8.

14. A method in which a computer program of item 8 is downloaded from an electronic data network onto a computer which is connected to the data network.

15. A method according to item 14, wherein the electronic data network is the Internet.

While the invention has been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. An electronic package, comprising:
a first electronic circuit configurable in a test mode, the first electronic circuit including: a digital input with first and second parallel input paths; and a digital output with first and second parallel output paths;
at least one second electronic circuit configurable in a test mode; and
an input/output path digitally coupling the first electronic circuit to the second electronic circuit;
wherein the first electronic circuit, in the test mode, is configured to: direct data received at the first parallel input path to the second electronic circuit via the input/output path; direct data received from the second electronic circuit via the input/output path to the first parallel output path; process data received at the second parallel input path; and direct the processed data to the second parallel output path; and
wherein the second electronic circuit, in the test mode, is configured to process the data received at the input/output path from the first electronic circuit and to direct the processed data to the first electronic circuit via the input/output path.

2. The electronic package according to claim 1, wherein data received from the second parallel input path is processed in the first electronic circuit at the same time as the data received from the first parallel data path is processed in the second electronic circuit.

3. The electronic package according to claim 1, wherein the first and second electronic circuits are electronic chips.

4. The electronic package according to claim 1, wherein the second electronic circuit further comprises an analog module with an analog input/output path.

5. The electronic package according to claim 1, wherein the first electronic circuit further comprises a data separating device operable to separate data received at the digital input into data to be processed by the second electronic circuit and into data to be processed by the first electronic circuit.

6. A method for electronically testing an electronic package including first and second electronic circuits, the method comprising:
connecting a digital input, a digital output, an analog input, and an analog output of the electronic package to an electronic testing device, the digital input including first and second input paths, the digital output including first and second output paths;
providing for each of the first and second electronic circuits a test pattern including an input test pattern to be applied to the electronic circuit and a corresponding expected output test pattern resulting from processing the input test pattern;
producing test data comprising a merged test pattern by merging respective lines of the test patterns of the first and second electronic circuits such that individual lines of the merged test pattern include lines from the respective test patterns of the first and second electronic circuits;
applying each line of the merged test pattern to the first and second input paths;
setting the first and second electronic circuits into a predetermined test mode, wherein the first electronic circuit: directs the test data received at the first input path to the second electronic circuit; directs the test data received from the second electric circuit to the first output path; processes test data received at the second input path; and directs the processed test data to the second output path, wherein processing of the test data in the first circuit and in the second circuit is performed essentially in parallel;
evaluating the output;
comparing output signals received from the first and second output paths with the expected output pattern; and
determining whether the output signals deviate from the expected output pattern.

7. The method according to claim 6, wherein NOP instructions are written into one part of the merged test pattern corresponding to respective lines of the test pattern of one of the electronic circuits in the event respective lines of the test pattern of one of the first and second electronic circuit no longer comprises valid test operation instructions and the other of the first and second electronic circuits still comprises valid test operation instructions.

* * * * *